(12) United States Patent
Lee

(10) Patent No.: US 9,702,931 B2
(45) Date of Patent: Jul. 11, 2017

(54) TEST CIRCUIT AND METHOD FOR SEMICONDUCTOR DEVICE

(71) Applicant: SK hynix Inc., Gyeonggi-do (KR)

(72) Inventor: Dong-Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 135 days.

(21) Appl. No.: 14/060,198

(22) Filed: Oct. 22, 2013

(65) Prior Publication Data

US 2014/0368224 A1 Dec. 18, 2014

(30) Foreign Application Priority Data

Jun. 18, 2013 (KR) .................. 10-2013-0069603

(51) Int. Cl.
| | | |
|---|---|---|
| *G01R 31/317* | (2006.01) | |
| *G11C 29/50* | (2006.01) | |
| *G11C 29/02* | (2006.01) | |
| *G01R 27/20* | (2006.01) | |
| *G01R 31/3185* | (2006.01) | |
| *H01L 21/66* | (2006.01) | |

(52) U.S. Cl.
CPC ..... *G01R 31/31717* (2013.01); *G01R 27/205* (2013.01); *G11C 29/025* (2013.01); *G11C 29/50008* (2013.01); *G01R 31/318513* (2013.01); *H01L 22/34* (2013.01)

(58) Field of Classification Search
CPC ............... G01R 3/00; G01R 31/31717; G01R 31/318513; G01R 27/205; G01D 18/00; G01D 5/142; H01L 22/34; G11C 29/50008; G11C 29/025
USPC .......................................... 324/691, 704–725
See application file for complete search history.

(56) References Cited

U.S. PATENT DOCUMENTS

| | | | | |
|---|---|---|---|---|
| 4,325,018 | A * | 4/1982 | Schade, Jr. .............. | G05F 3/30 323/313 |
| 6,022,750 | A * | 2/2000 | Akram et al. ................. | 438/18 |
| 7,403,028 | B2 * | 7/2008 | Campbell ............... | 324/755.03 |
| 2003/0085461 | A1* | 5/2003 | Sakiyama et al. ........... | 257/700 |
| 2010/0013512 | A1* | 1/2010 | Hargan ................... | H01L 22/22 324/762.02 |
| 2011/0093224 | A1* | 4/2011 | Ide ........................ | G11C 29/02 702/64 |
| 2011/0102006 | A1* | 5/2011 | Choi et al. ................. | 324/750.3 |
| 2013/0230932 | A1* | 9/2013 | Bringivijayaraghavan et al. ................................. | 438/4 |
| 2013/0342231 | A1* | 12/2013 | Alfano et al. .......... | 324/750.16 |
| 2014/0351783 | A1* | 11/2014 | Haridass et al. .............. | 716/134 |

FOREIGN PATENT DOCUMENTS

| | | |
|---|---|---|
| KR | 1020110046894 | 5/2011 |
| KR | 1020130007119 | 1/2013 |

* cited by examiner

*Primary Examiner* — Patrick Assouad
*Assistant Examiner* — Khristopher Yodichkas
(74) *Attorney, Agent, or Firm* — IP & T Group LLP

(57) ABSTRACT

A semiconductor device includes a first die, a second die coupled to the first die through a Through-Silicon-Via (TSV), and a test circuit suitable for measuring a resistance of the TSV by controlling an amount of current flowing through the TSV.

13 Claims, 6 Drawing Sheets

TEST CIRCUIT AND METHOD FOR SEMICONDUCTOR DEVICE

CROSS-REFERENCE TO RELATED APPLICATIONS

The present application claims priority of Korean Patent Application No. 10-2013-0069603, filed on Jun. 18, 2013, which is incorporated herein by reference in its entirety.

BACKGROUND

1. Field

Exemplary embodiments of the present invention relate to a semiconductor test circuit for measuring a resistance of a Through-Silicon-Via (TSV), and a semiconductor device including the semiconductor test circuit.

2. Description of the Related Art

Packaging technology for a semiconductor integrated circuit has made progress continuously to satisfy the demands for minimization and reliability of the semiconductor integrated circuit. As recent products are required to realize high performance as well as small size, diverse stack packaging methods are being developed. Among them is a three-dimensional (3D) semiconductor device whose integration degree is raised by stacking a plurality of chips in a single package to achieve high integration of the device.

Stacking technology, which means piling up of at least two chips or packages vertically, may realize more than twice as much memory capacity as that of a 2D device, such as a 2D semiconductor memory device. Besides the increased memory capacity, the stack package is also advantageous in terms of mount density and the efficiency of mount space. For these reasons, the industry is accelerating research and development on the stack package.

The individual semiconductor chips of a stack package are electrically connected to each other through metal wire or Through-Silicon-Via (TSV). The TSV of the stack package is formed inside the semiconductor chips, and the stacked semiconductor chips are electrically connected to each other through the TSV. The stack package using the TSV capable of interfacing signals and power may have excellent operation performance due to improved bandwidth while minimizing current consumption and signal delay.

Because reliable connection between the stacked chips through the TSV is important, the resistance of the TSV after packaging is measured to check the connection of the TSV. For measurement of the resistance of TSV, a first die of the stacked chips is connected to a particular test pad, and a second die of the stacked chips is provided with a test driver. The test driver supplies power to the TSV and the current flowing through the TSV is monitored at the test pad. Such measurement, however, hardly measures the resistance of the TSV because of noise including resistance due to the distance to the test pad and a transistor involved in the measurement. Since the resistance of the transistor involved in the measurement is relatively greater than the resistance of the TSV, measurement error becomes significant. After all, since errors occur from the PVT (Process, Voltage, and Temperature) of the transistor involved in the measurement, it is difficult to accurately measure the resistance of the TSV.

SUMMARY

An embodiment of the present invention is directed to a semiconductor device that may minimize measurement error in testing a Through-Silicon-Via (TSV) of stacked chips after packaging.

In accordance with an embodiment of the present invention, a semiconductor device includes a first die, a second die coupled to the first die through a Through-Silicon-Via (TSV), and a test circuit suitable for measuring a resistance of the TSV by controlling an amount of current flowing through the TSV.

In accordance with another embodiment of the present invention, a semiconductor device includes a first die, a plurality of second dies, each of which is couples to the first die through a Through-Silicon-Via (TSV), a current source suitable for supplying a first current in response to a first control signal and a second current in response to a second control signal, the first and the second current flows through the TSV, and the current source being disposed in each of the second dies, a current sink suitable for generating a measurement voltage whose level depends on the first current, or both of the first current and the second current, the current sink being disposed in the first die, and a resistance measurer suitable for measuring a resistance of the TSV based on the measurement voltage.

In accordance with yet another embodiment of the present invention, a method for measuring a resistance of a TSV in a semiconductor device including a first die and a second die that are electrically connected to each other through the TSV includes supplying a first current to the first die from the second die through the TSV; measuring the first current through the TSV at the first die; supplying the first current and a second current to the first die from the second die through the TSV; measuring a sum of the first and the second current through the TSV at the first die; and obtaining the resistance of the TSV based on a difference between the measured first current and the measured sum of the first and second current.

In accordance with yet another embodiment of the present invention, a test circuit comprises a current source units suitable for supplying a variable current flowing through a TSV through which a first die and a second die are coupled to each other and a measuring block suitable for measuring the resistance of the TSV based on an equation $$RTSV = VDD \times \left(\frac{2 \times I_1 - I_{1n2}}{I_1 \times I_{1n2}}\right)$$

where RTSV denotes the resistance of the TSV, VDD denotes a power source I1 denotes a first current, and I1n2 denotes a sum of the first current and a second current, wherein the first and second currents flow through the TSV from the current source units to the measuring block.

DETAILED DESCRIPTION

Figure 1:
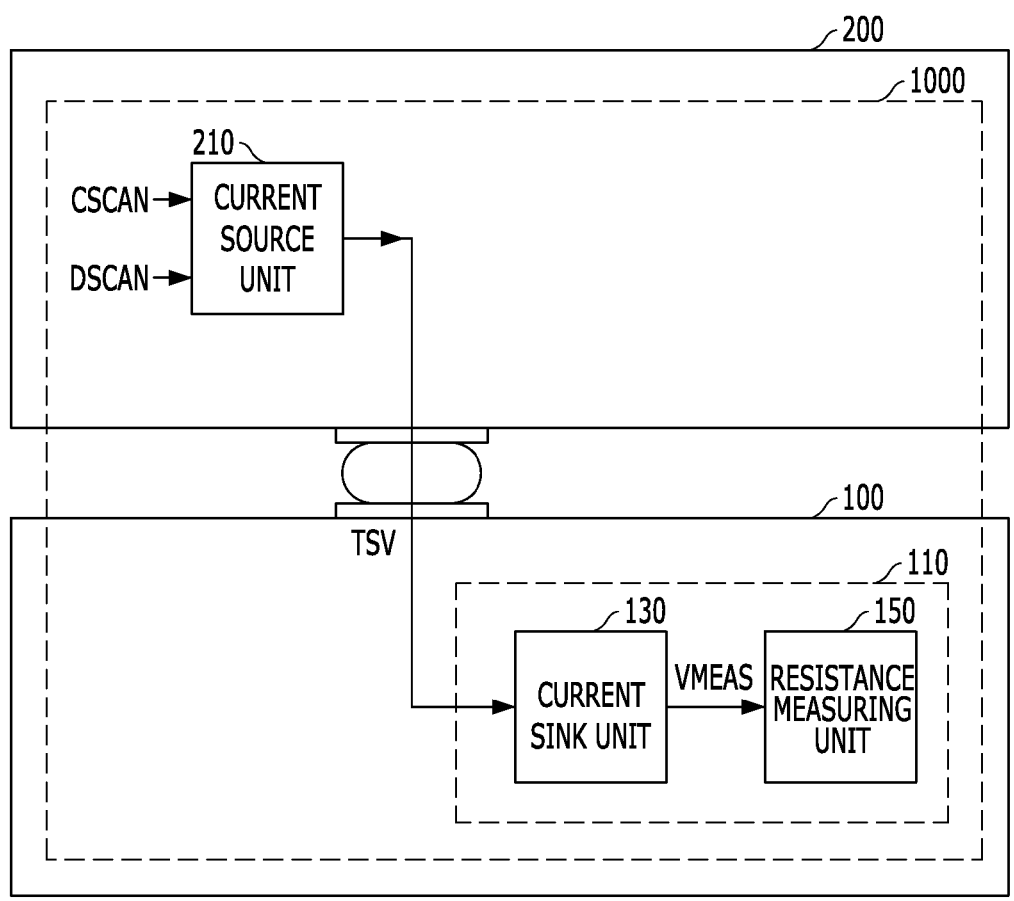
FIG. 1 is a block diagram illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor device in accordance with an embodiment of the present invention.

Referring to FIG. 1, the semiconductor device including a test circuit 1000 may include a first die 100 and a second die 200 coupled to each other with a Through-Silicon-Via (TSV).

The first die 100 may be a master die and the second die 200 may be a slave die.

The test circuit 1000 may include a current source unit 210 and a measuring block 110. The current source unit 210 may be disposed in the second die 100, and the measuring block 110 may be disposed in the first die 100. The current source unit 210 comprises a plurality of current sources and supplies a variable current to the TSV in response to a control signal (not shown). The measuring block 110 measures the resistance of the TSV with the variable current flowing from the current source unit 210. The measuring block 110 may include a current sink unit 130 for generating a measurement voltage VMEAS, which has a level that depends on the variable current flowing from the current source unit 210 to the measuring block 110 in response to the control signal. Also, the measuring block 110 may include a resistance measuring unit 150 for measuring the resistance of the TSV based on the measurement voltage VMEAS.

Figure 2:
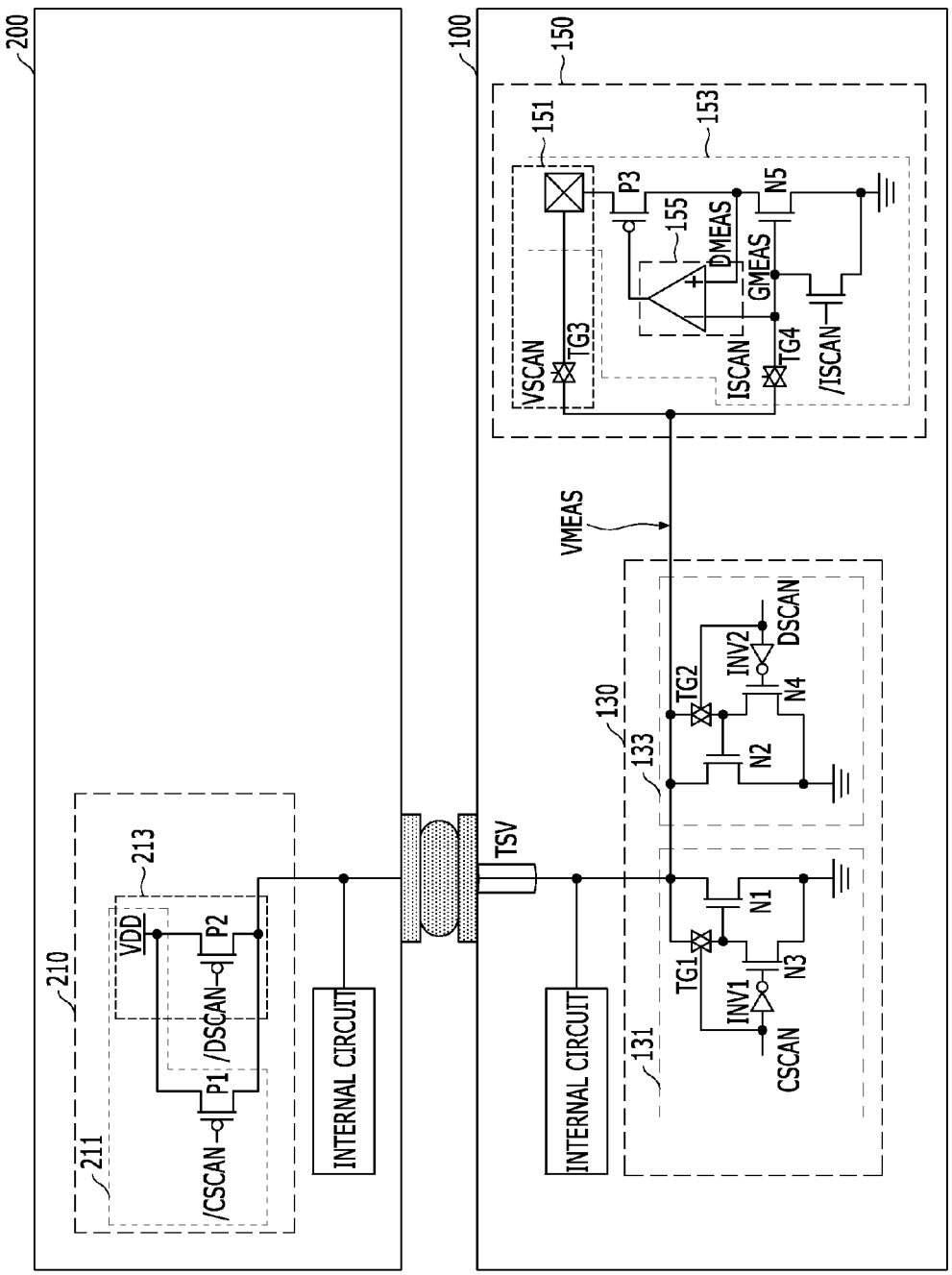
FIG. 2 is a detailed circuit diagram of the semiconductor device shown in FIG. 1 in accordance with an embodiment of the present invention.

FIG. 2 is a detailed circuit diagram of the semiconductor device shown in FIG. 1 in accordance with an embodiment of the present invention.

Various internal circuits disposed in the first die 100 and counterparts disposed in the second die 200 may communicate signals and power to each other through the TSV.

In the second die 200, the current source unit 210 may include a first current source 211 for supplying a first current to the TSV in response to a first control signal CSCAN and a second current source 213 for supplying a second current to the TSV in response to a second control signal DSCAN. The first control signal CSCAN and the second control signal DSCAN are control signals for test operation.

In the first die 100, the current sink unit 130 may generate the measurement voltage VMEAS, which has a level depends on the first current flowing from the first current source 211 or both of the first current and the second current flowing from the second current source 213.

The current source unit 210 may include a first PMOS transistor P1 and a second PMOS transistor P2 that are enabled in response to the first control signal CSCAN and the second control signal DSCAN, through a gate, respectively. Each of the first PMOS transistor P1 and the second PMOS transistor P2 has a source coupled with a power source voltage VDD and a drain coupled with the TSV. The first PMOS transistor P1 and the second PMOS transistor P2 transfer the power source voltage VDD to the TSV in response to the first control signal CSCAN and the second control signal DSCAN input to the gates.

The current sink unit 130 may include a first current sink 131 for generating the measurement voltage VMEAS based on the first current in response to the first control signal CSCAN, and a second current sink 133 for generating the measurement voltage VMEAS based on the second current in response to the second control signal DSCAN.

The first current sink 131 includes a first transmission gate TG1 and a first NMOS transistor N1 to generate the measurement voltage VMEAS based on the first current flowing from the first current source 211 in response to the first control signal CSCAN and a third NMOS transistor N3. The first transmission gate TG1 may be coupled between the drain and a gate of the first NMOS transistor N1 to form a gate-drain clamp. The first transmission gate TG1 may be controlled in response to the first control signal CSCAN. The first NMOS transistor N1 has a drain-source path coupled between the TSV and a ground power source VSS. The third NMOS transistor N3 may have a drain-source path between the gate of the first NMOS transistor N1 and the ground power source VSS.

The second current sink 133 includes a second transmission gate TG2 and a second NMOS transistor N2 to generate the measurement voltage VMEAS based on the second current flowing from the second current source 213 in response to the second control signal DSCAN and a fourth NMOS transistor N4. The second transmission gate TG2 may be coupled between the drain and a gate of the second NMOS transistor N2 to form a gate-drain clamp. The second transmission gate TG2 may be controlled in response to the second control signal DSCAN. The second NMOS transistor N2 has a drain-source path coupled between the TSV and the ground power source VSS. The fourth NMOS transistor N4 may be coupled between the gate of the second NMOS transistor N2 and the ground power source VSS.

The inverted version of the first control signal CSCAN and the second control signal DSCAN may be inputted to gates of the third and fourth NMOS transistors N3 and N4, respectively.

When both of the first control signal CSCAN and the second control signal DSCAN are in a logic low level, the current sink unit 130 becomes a floating state. When the first control signal CSCAN or the second control signal DSCAN is in a logic high level, the first NMOS transistor N1 and the second NMOS transistor N2 become a gate-drain clamp or a driver of a current mirror and generate the measurement voltage VMEAS.

The resistance measuring unit 150 measures the measurement voltage VMEAS corresponding to the first current flowing from the first current source 211, and then measures the measurement voltage VMEAS corresponding to both of the first current flowing from the first current source 211 and the second current flowing from the second current source 213.

The resistance measuring unit 150 may include a voltage measurer 151 and a current measurer 153. The voltage measurer 151 may measure the measurement voltage VMEAS. The current measurer 153 may convert the measurement voltage VMEAS into a current level and measure the current level. The voltage measurer 151 may include a pad and a transmission gate TG3 and provide the measurement voltage VMEAS to the pad in response to a voltage monitoring signal VSCAN. The current measurer 153 may include an offset canceller 155 for removing offset of the measurement voltage VMEAS and a transmission gate TG4 operating in response to a current monitoring signal ISCAN.

The current measurer 153 may further include a third PMOS transistor P3 and a fifth NMOS transistor N5 coupled with the offset canceller 155. The offset canceller 155 is formed of an OP-AMP. The offset canceller 155 may output signal keeping voltage levels of a gate GMEAS and a drain DMEAS of the fifth NMOS transistor N5 the same. A non-inverted input of the offset canceller 155 may be connected to the drain DMEAS and an inverted input of the offset canceller 155 may be connected to the gate GMEAS. Since the output signal of the offset canceller 155 is coupled with the gate of the third PMOS transistor P3, the offset canceller 155 may control a voltage of the gate of the third PMOS transistor P3. Current may be measured through the pad and the third PMOS transistor P3, which has a gate voltage that is controlled by the offset canceller 155.

When the current monitoring signal ISCAN is enabled, the measurement voltage VMEAS of the TSV is applied to the inverted input terminal of the offset canceller 155 and the gate GMEAS of the fifth NMOS transistor N5. When the fifth NMOS transistor N5 is turned on, a voltage is applied to the drain DMEAS coupled to the non-inverted input terminal. When voltage levels of a gate GMEAS and a drain DMEAS of the fifth NMOS transistor N5 become the same, the third PMOS transistor P3 becomes turned on in response to the output signal of the offset canceller 155 applied to a gate of the PMOS transistor P3.

Here, the fifth NMOS transistor N5 may be substantially the same as the first and second NMOS transistors N1 and N2 of the current sink unit 130, which makes PVT (Process, Voltage and Temperature) skews of the NMOS transistors N1, N2 and N5 similar to one another. Thus the same current flows to the NMOS transistors N1, N2 and N5 because the measurement voltage VMEAS is applied to the NMOS transistors N1, N2 and N5 having the same gate-source voltage $V_{GS}$ and the same drain-source voltage $V_{DC}$. In other words, the current measurer 153 receives the measurement voltage VMEAS in response to the current monitoring signal ISCAN, converts the measurement voltage VMEAS into a current having a minimized offset, and measures the resistance of the TSV through the pad.

According to the embodiment of the present invention, the resistance of the TSV is measured with a current flowing through the TSV in response to the first control signal CSCAN and the second control signal DSCAN. The measurement error caused by the transistor at the measurement end in the conventional technology of measuring the resistance of TSV may be removed by measuring the current amount by the first control signal CSCAN and the current amount by the first and second control signals CSCAN and DSCAN. This may be summarized as the following equations.

$$RDRV_1 + RTSV = \frac{VDD}{I_1} \quad [\text{EQUATION 1}]$$

$$RDRV_{1n2} + RTSV = \frac{VDD}{I_{1n2}}$$

For EQUATION 1, $RDRV_1$ denotes an equivalent resistance of serial resistances representing the first PMQS transistor P1 and the first NMOS transistor N1. $RDRV_{1n2}$ denotes an equivalent resistance of serial resistance representing the first and second PMOS transistors P1 and P2 in parallel and the first second NMOS transistors N1 and N2 in parallel. RTSV denotes the resistance of the TSV. $I_1$ denotes the first current flowing from the first current source 211 or the first PMOS transistor P1 to the first NMOS transistor N1 through the TSV when the first control signal CSCAN is enabled. $I_{1n2}$ denotes the first current and the second current flowing from the second current source 213 or the first and second PMOS transistors P1 and P2 to the first second NMOS transistors N1 and N2 through the TSV when the first control signal CSCAN and the second control signal DSCAN are enabled.

When it is assumed that the resistance of the TSV is much smaller than the resistance of the transistor used for the measurement of the TSV, it becomes:

$$RTSV \ll RDRV_1, RDRV_2 \quad [\text{EQUATION 2}]$$

$$RDRV_1 + RTSV \cong RDRV_1 = \frac{VDD}{I_1}$$

$$RDRV_2 + RTSV \cong RDRV_2 = \frac{VDD}{I_{1n2}}$$

$$RDRV_1 = 2 \times RDRV_2$$

Therefore, the resistance of the TSV to be measured may be represented by EQUATION 3:

$$RTSV = VDD \times \left(\frac{2 \times I_1 - I_{1n2}}{I_1 \times I_{1n2}}\right) \quad [\text{EQUATION 3}]$$

In short, the resistance of the TSV may be measured more accurately since, as shown in EQUATION 3, the measurement error or the resistance terms $RDRV_1$ and $RDRV_{1n2}$ of the transistors during the measurement of the resistance of the TSV may be eliminated through the measurement with enablement of the first control signal CSCAN and the measurement with enablement of both first control signal CSCAN and second control signal DSCAN.

Hereinafter, referring to FIGS. 1 and 2, a method for measuring a resistance of a Through-Silicon-Via (TSV) in a semiconductor device including a first die and a second die electrically connected to each other through the TSV is described in detail.

First, the current source unit 210 disposed in the second die 200 supplies the first current to the current sink unit 130 of the measuring block 110 disposed in the first die through the TSV in response to the first control signal CSCAN. The measuring block 110 measures the first current. Then, the current source unit 210 supplies the first and the second currents to the current sink unit 130 through the TSV in response to the first and the second control signals CSCAN and DSCAN. The measuring block 110 measures the first and the second currents, thereby the resistance of the TSV being measured with EQUATION 3.

At this time, the measuring of the first current and the second current may be performed by measuring a voltage corresponding to the first current and a voltage corresponding to the second current.

Figure 3:
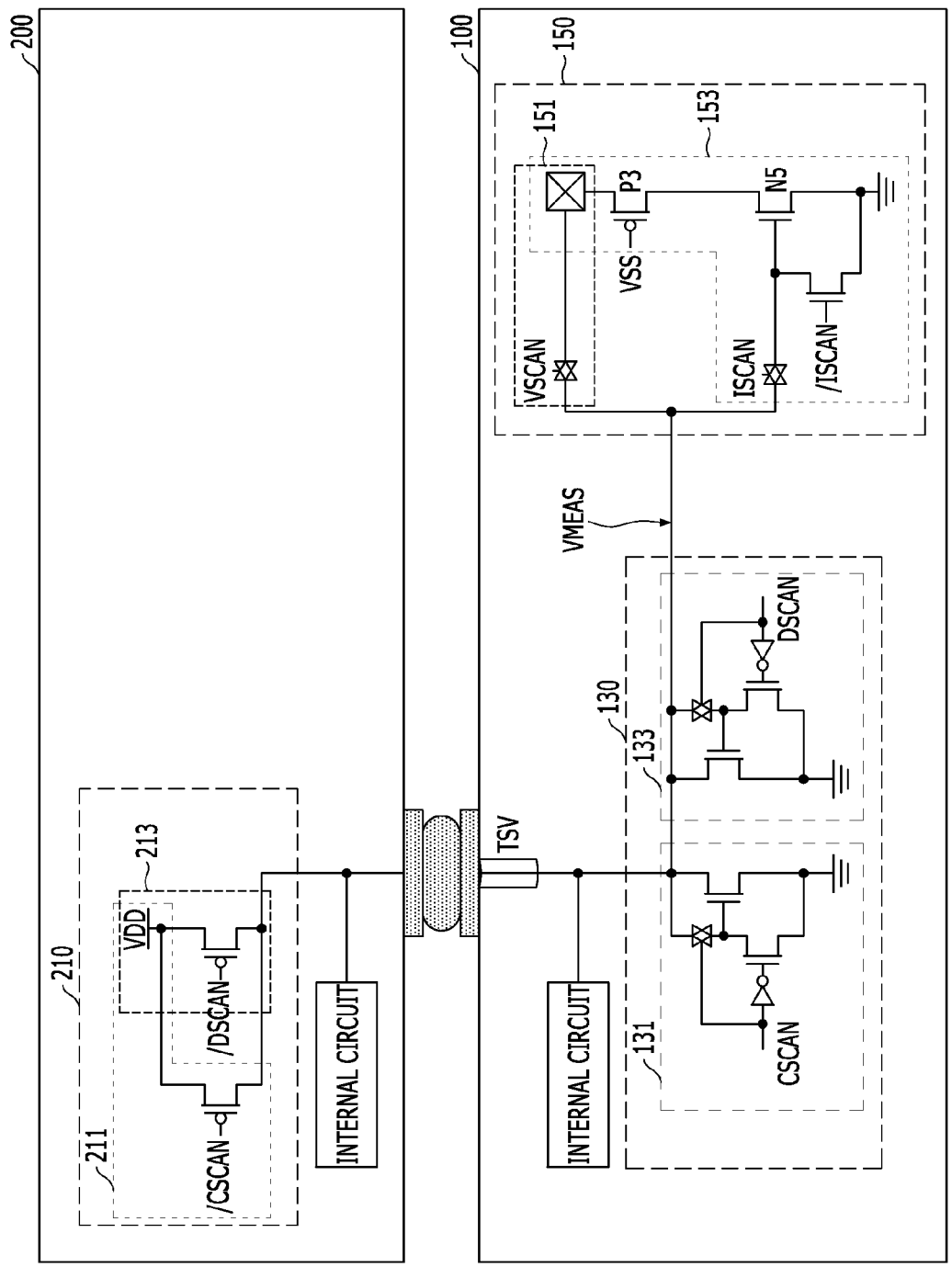
FIG. 3 is a detailed circuit diagram of the semiconductor device shown in FIG. 1 in accordance with an embodiment of the present invention.

FIG. 3 is a detailed circuit diagram of a semiconductor device shown in accordance with another embodiment of the present invention.

The semiconductor device illustrated in FIG. 3 is same as the semiconductor device illustrated in FIG. 2 except that the resistance measuring unit 150 does not use the offset canceller 155 or the OP-AMP.

When the current monitoring signal ISCAN is enabled, the measurement voltage VMEAS may be applied as the gate of the fifth NMOS transistor N5. When the measurement voltage VMEAS is enabled, a current running through the third PMOS transistor P3 may be measured at the pad. When the current monitoring signal ISCAN is disabled, the resistance measuring unit 150 becomes a floating state by the fifth NMOS transistor N5 to be coupled to a ground power source VSS.

Figure 4:
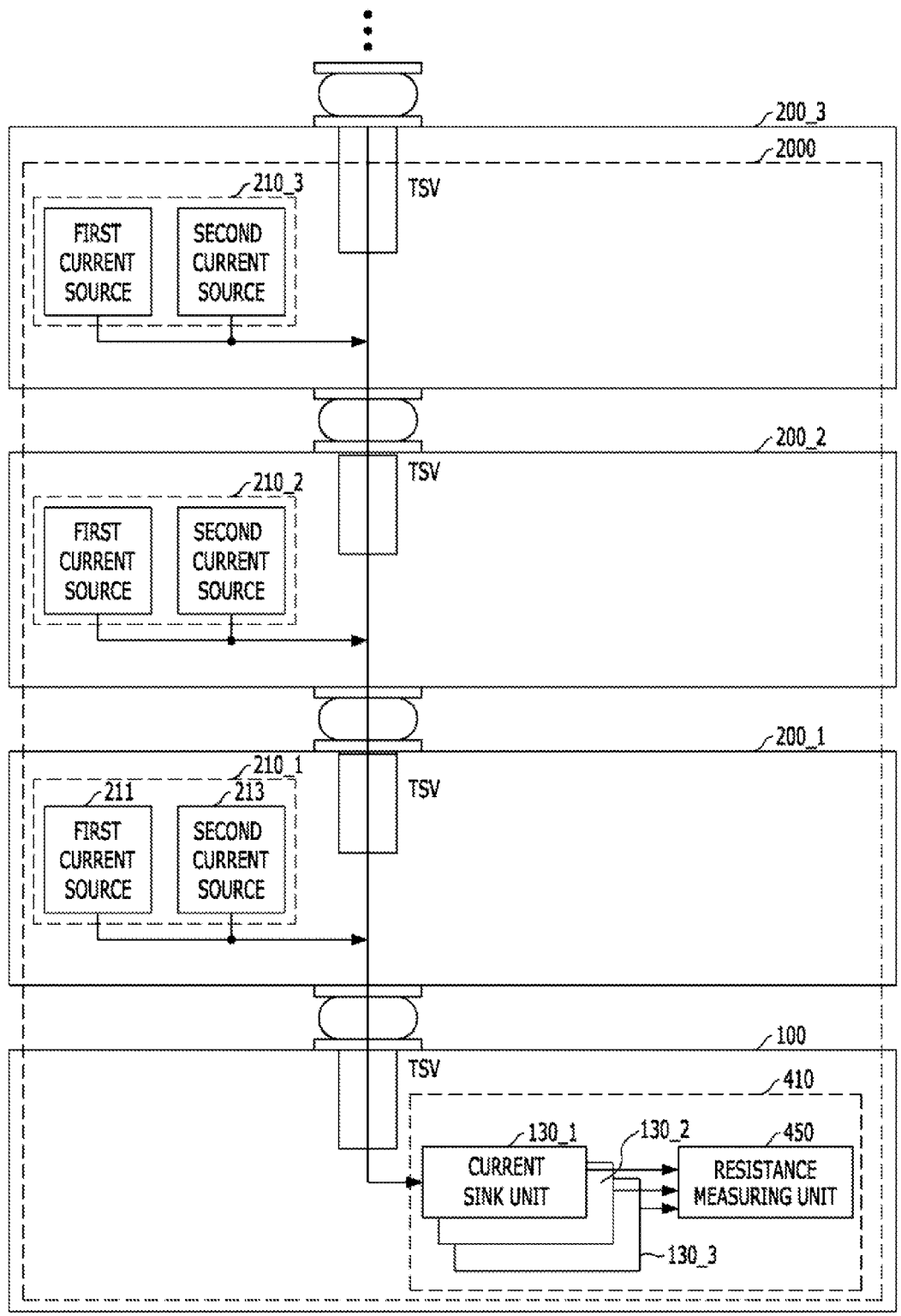
FIG. 4 is a block diagram illustrating a semiconductor device in accordance with an embodiment of the present invention.

FIG. 4 is a block diagram illustrating a semiconductor device in accordance with another embodiment of the present invention.

Referring to FIG. 4 the semiconductor device having a test circuit 2000 may include a first die 100 and a plurality of second dies 200_1 to 200_3 stacked over the first die 100. The number of the second dies may vary according to circuit design.

The test circuit 2000 may include a plurality of current source units 210_1 to 201_3 each of which is disposed in each of the second dies 200_1 to 200_3. Each of the current source units 210_1 to 210_3 may include a first current source 211 for supplying a first current to the TSV in response to a first control signal CSCAN and a second current source 213 for supplying a second current to the TSV in response to a second control signal DSCAN.

The test circuit 2000 may further include a measuring block 410. The measuring block 410 measures the resistance of the TSV with the variable current flowing from the current source units 210_1 to 210_3. The measuring block 410 may include a resistance measuring unit 450 and a plurality of current sink units 130_1 to 130_3 that respectively correspond to the second dies 200_1 to 200_3. The resistance measuring unit 150 and a plurality of current sink units 130_1 to 130_3 may be disposed in the first die 100. Each of the current sink units 130_1 to 130_3 may generate its own measurement voltage VMEAS, which leas a level that depends on the variable current flowing from the current source units 210_1 to 210_3 to the measuring block 410 in response to the control signal. The resistance measuring unit 450 may measure the resistance of the TSV based on the measurement voltage VMEAS.

The structure and operation of each of the current source units 210_1 to 201_3, the first current source 211, the second current source 213, and the current sink units 130_1 to 130_3 are substantially the same as the current source units 210, the first current source 211, the second current source 213, and the current sink unit 130 shown in FIGS. 1 to 3, respectively. The difference between the resistance measuring unit 450 and the resistance measuring unit 150 will be described below.

Figure 5:
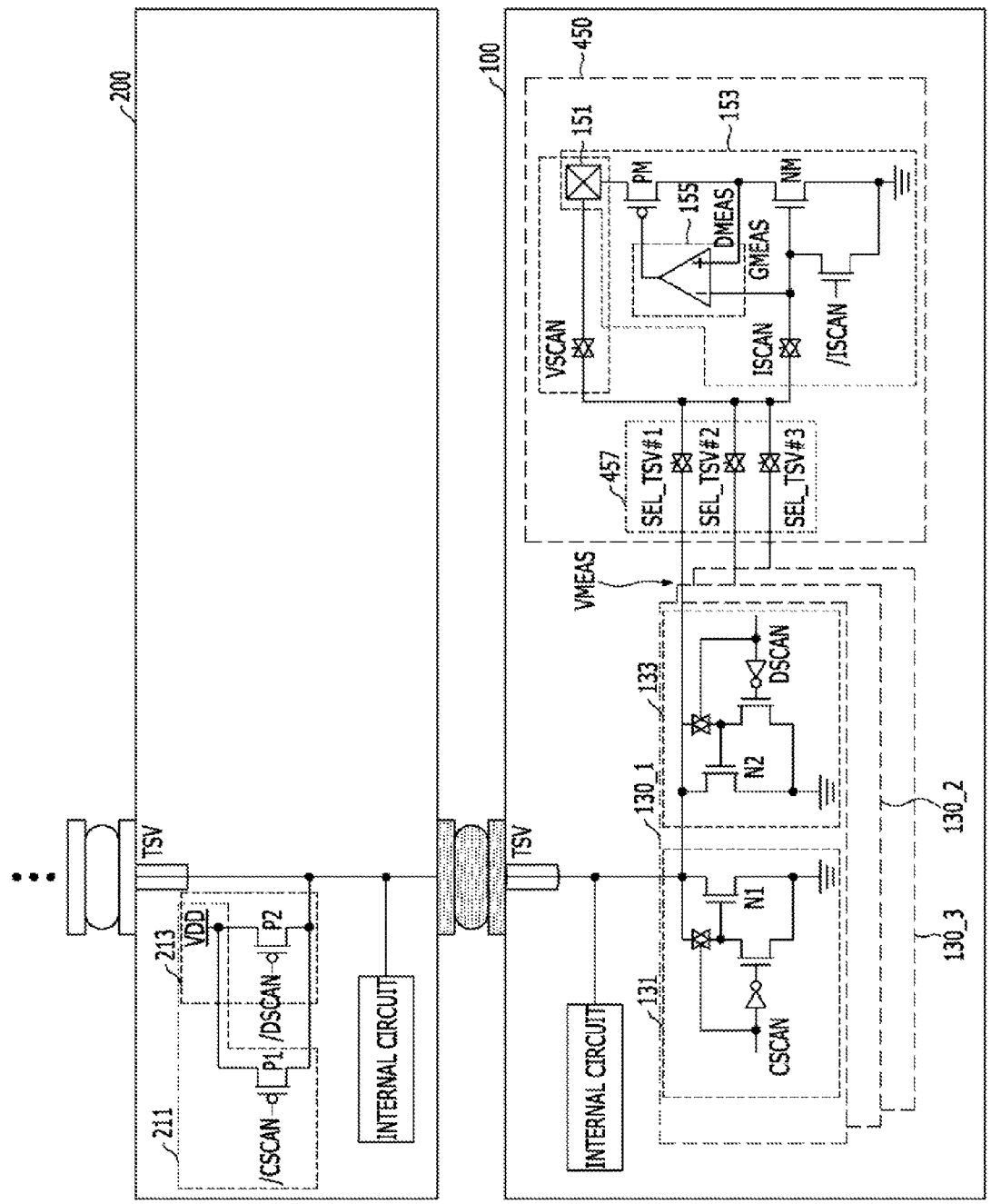
FIG. 5 is a detailed circuit diagram of the semiconductor device shown in FIG. 4.

FIG. 5 is a detailed circuit diagram of the semiconductor device shown in FIG. 4.

FIG. 5 illustrates one 201_1 of the second dies 200_4 to 200_3 shown in FIG. 4.

Each of the current sink units 130_1 to 130_3 may generate a measurement voltage VMEAS, which has a level that depends on a first current flowing from the first current source 211 and the first current and a second current flowing from the second current source 213 of each of the current source units 210_1 to 210_3.

The resistance measuring unit 450 may include a voltage measurer 151 and a current measurer 153 substantially the same as the voltage measurer 151 and the current measurer 153 illustrated in FIGS. 2 and 3. The resistance measuring unit 150 may not use the offset canceller 155 or the OP-AMP as disclosed in connection with FIG. 3.

The resistance measuring unit 450 may include a switch 457 for selecting one of the plurality of the measurement voltages VMEAS generated by the current sink units 130_1 to 130_3. As disclosed above, each of the current sink units 130_1 to 130_3 may generate its own measurement voltage VMEAS based on the variable current flowing from the current source units 210_1 to 210_3 in the second dies 200_1 to 200_3 though corresponding TSV. The switch 157 may select one of the plurality of the measurement voltages VMEAS based on the variable current flowing the TSV, which has a resistance that is to be measured, through a plurality of transmission gates under the control of selection signals SEL_TSV#1 to SEL_TSV#3 corresponding to the current source units 210_1 to 210_3, respectively. That is, the selection signals SEL_TSV#1 to SEL_TSV#3 may select one of the measurement voltages VMEAS corresponding to the TSV, which has a resistance that is to be measured. The measurement voltages VMEAS selectively pass through the transmission gate under the control of the selection signals SEL_TSV#1 to SEL_TSV#3 and are transferred to the voltage measurer 151 and the current measurer 153.

Figure 6:
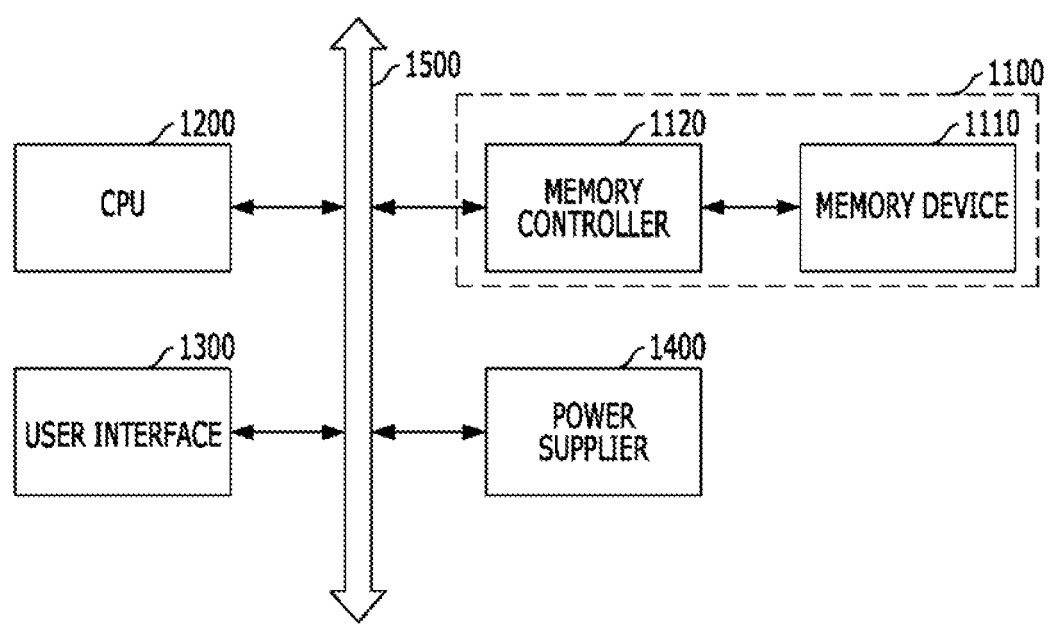
FIG. 6 is a block diagram illustrating an information processing system in accordance with an embodiment of the present invention.

FIG. 6 is a block diagram illustrating an information processing system in accordance with an embodiment of the present invention.

Referring to FIG. 6, the information processing system may include a memory system 1100, a central processing unit 1200, a user interface 1300, and a power supplier 1400. The constituent elements may communicate data with each other through a bus 1500.

The memory system 1100 may include a memory device 1110 and a memory controller 1120. The memory device 1110 may store data processed by the central processing unit 1200 or data inputted from the outside through the user interface 1300. The memory device 1110 may include the test circuit suggested and described in the above embodiments of the present invention.

The information processing system may be included in all electronic devices required to store data. For example, the information processing system may be applied to a memory card, a Solid-State Disk (SSD), and diverse mobile devices such as smart phones.

As described above, the memory device ray accurately measure the resistance of the TSV, which increases the reliability of the memory device.

The semiconductor device in accordance with the embodiment of the present invention may measure accurate resistance distribution of a TSV after stack package. Therefore, it is possible to improve a fabrication process of stack package with the TSV, thus saving production cost and time and improving throughput of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a first die;
   a second die coupled to the first die through a Through-Silicon-Via (TSV); and a test circuit configured to generate measured values to be used in obtaining a resistance of the TSV by controlling an amount of current flowing through the TSV, wherein the test circuit includes:
- a current source included in the second die and configured to supply a plurality of variable currents flowing through the TSV in response to a plurality of control signals; and
- a measuring block configured to generate the measured values to be used in obtaining the resistance of the TSV based on the plurality of variable currents, wherein the measuring block measures at least one current among the plurality of variable currents, measures a sum of the plurality of variable currents through the TSV, and generates the measured values corresponding to the at least one current and the sum of the plurality of variable currents to be used in obtaining the resistance of the TSV based on a difference between the at least one current and the sum of the plurality of variable currents.

2. The semiconductor device of claim 1, wherein the measuring block includes:
- a current sink unit configured to generate a first voltage having a level that depends on the at least one current and a second voltage having a level that depends on the sum of the plurality of variable currents in response to the plurality of control signals; and
- a measuring unit configured to output the measured values corresponding to the first and second voltages to be used in obtaining the resistance of the TSV based on the measurement voltage.

3. The semiconductor device of claim 2, wherein the measuring unit includes:
- a voltage measurer configured to output the first and second voltages as the measured values; and
- a current measurer configured to convert the first and second voltages to first and second currents and output the first and second currents as the measured values.

4. The semiconductor device of claim 3, wherein the current measurer includes an offset canceller configured to remove an offset of the first and second voltages.

5. The semiconductor device of claim 1, wherein the measuring block is disposed in the first die.

6. A semiconductor device comprising:
- a first die;
- a plurality of second dies, each of which is coupled to the first die through a Through-Silicon-Via (TSV);
- a current source configured to supply a first current in response to a first control signal and supply a second current in response to a second control signal, wherein the first current and the second current flows through the TSV, and the current source is disposed in each of the second dies;
- a current sink configured to generate a measurement voltage having a level that depends on the first current or depends on both of the first current and the second current, wherein the current sink is disposed in the first die; and
- a measurer configured to output a measured value to be used in obtaining a resistance of the TSV based on the measurement voltage, wherein the current sink unit generates a first measurement voltage representing the first current through the TSV and generates a second measurement voltage representing a sum of the first and second currents through the TSV, and the measuring unit outputs a measured value corresponding to the first or second voltage to be used in obtaining the resistance of the TSV based on a difference between the first current and the sum of the first and second currents.

7. The semiconductor device of claim 6, wherein the current sink includes:
- a first current sink configured to generate the first measurement voltage corresponding to the first current in response to the first control signal; and
- a second current sink which generates the second measurement voltage corresponding to the second current in response to the second control signal.

8. The semiconductor device of claim 6, wherein the measurer includes:
- a voltage measurer configured to output the first or second measurement voltage as the measured value; and
- a current measurer configured to convert the first or second measurement voltage into a converted current and output the converted current as the measured value.

9. The semiconductor device of claim 8, wherein the current measurer includes an offset canceller which removes an offset of the first or second measurement voltage.

10. The semiconductor device of claim 6, wherein the current sink comprises a number of current sinks and the number of current sinks corresponds with the number of the second dies.

11. The semiconductor device of claim 6, wherein the measurer includes:
- a switch which selects the first and second measurement voltages corresponding to the first and second currents flowing through a target TSV to be measured among the TSVs corresponding to the second dies.

12. A method for measuring a resistance of a Through-Silicon-Via (TSV) in a semiconductor device including a first die and a second die that are electrically connected to each other through the TSV, the method comprising:
- supplying a first current to the first die from the second die through the TSV;
- measuring the first current through the TSV at the first die;
- supplying the first current and a second current to the first die from the second die through the TSV;
- measuring a sum of the first and the second current through the TSV at the first die; and
- outputting a measured value corresponding to the measured first current and the measured sum of the first and second currents to be used in obtaining the resistance of the TSV based on a difference between the measured first current and the measured sum of the first and second current.

13. The method of claim 12, wherein the measuring of the first current through the TSV at the first die and the measuring of the second current through the TSV at the first die include:
- measuring a first voltage corresponding to the first current as the measured first current and a second voltage corresponding to the sum of the first and second currents as the measured sum of the first and second currents.

* * * * *